United States Patent [19]

Hill, III et al.

[11] Patent Number: 5,273,060
[45] Date of Patent: Dec. 28, 1993

[54] ALCOHOL SPRAY CLEANING SYSTEM

[75] Inventors: Walter E. Hill, III; Dale J. Skulborstad; John B. Howard, Jr., all of Littleton; Kenneth P. Marts, Morrsion, all of Colo.

[73] Assignee: Martin Marietta Corporation, Bethesda, Md.

[21] Appl. No.: 65,853

[22] Filed: May 21, 1993

Related U.S. Application Data

[63] Continuation-in-part of Ser. No. 905,107, Jun. 26, 1992, abandoned.

[51] Int. Cl.$^5$ .................. B08B 3/02; B08B 13/00
[52] U.S. Cl. .................. 134/57 R; 68/209; 134/111; 134/113; 134/200; 169/61; 454/56
[58] Field of Search .......... 134/57 R, 117, 113, 134/200; 68/209; 169/60, 61; 454/52, 56

[56] References Cited

U.S. PATENT DOCUMENTS

| | | | |
|---|---|---|---|
| 3,580,261 | 5/1971 | Key | 134/104 |
| 4,101,340 | 7/1978 | Rand | 134/11 |
| 4,132,567 | 1/1979 | Blackwood | 134/1 |
| 4,187,868 | 2/1980 | Rudolphi | 134/184 |
| 4,262,430 | 4/1981 | Janson et al. | 34/43 |
| 4,390,396 | 6/1983 | Koblenzer | 202/166 |
| 4,443,269 | 4/1984 | Capella et al. | 134/12 |
| 4,561,903 | 12/1985 | Blaul | 134/10 |
| 4,676,261 | 6/1987 | Blaul | 134/57 |
| 4,688,585 | 8/1987 | Vetter | 134/56 R |
| 4,765,413 | 8/1988 | Spector et al. | 169/61 |
| 4,832,753 | 5/1989 | Cherry et al. | 134/22.18 |
| 4,865,061 | 9/1989 | Fowler et al. | 134/108 |
| 4,886,081 | 12/1989 | Blaul | 134/18 |
| 4,936,922 | 6/1990 | Cherry | 134/22.18 |
| 4,940,494 | 7/1990 | Petit et al. | 134/1 |
| 4,977,688 | 12/1990 | Roberson, Jr. et al. | 34/92 |
| 4,993,199 | 2/1991 | Hughes | 51/426 |
| 5,011,542 | 4/1991 | Weil | 134/38 |
| 5,027,841 | 7/1991 | Breunsbach et al. | 134/95 |
| 5,045,120 | 9/1991 | Mittag et al. | 134/26 |
| 5,103,846 | 4/1992 | Clark et al. | 134/57 R |

*Primary Examiner*—Philip R. Coe
*Attorney, Agent, or Firm*—Dorr, Carson, Sloan & Peterson

[57] ABSTRACT

A spray cleaning system is designed to use a flammable solvent, such as isopropyl alcohol, and includes safety features to maintain the concentration of solvent vapor within the cleaning chamber below a safe limit. The system includes a chamber for containing the article to be cleaned, a nozzle for directing a spray of solvent against the article, and a pump for supplying solvent to the nozzle. The chamber is ventilated with a flow of air to maintain the concentration of solvent vapor within the chamber below a predetermined safety limit, such as the lower explosive limit for the solvent, and the air is exhausted to create a negative pressure within the chamber. A sensor detects combustion or an explosion within the chamber. Additional sensors can be included to monitor leakage of solvent from the cleaning chamber or solvent supply tank. The flow of solvent to the nozzle is automatically halted in the event of combustion or explosion, or if solvent leakage is detected. A fire extinguishing system is also automatically triggered. Electrical continuity to ground is maintained among all of the components of the cleaning chamber as well as the solvent storage tank, pumps, and pipelines to mitigate static discharge.

20 Claims, 4 Drawing Sheets

ALCOHOL SPRAY CLEANING SYSTEM

RELATED APPLICATION

The present application is a continuation-in-part of Applicants' co-pending U.S. patent application Ser. No. 07/905,107 filed on Jun. 26, 1992, and now abandoned.

BACKGROUND OF THE INVENTION

1. Field of the Invention

The present invention relates generally to the field of precision cleaning systems. More specifically, the present invention discloses a spray cleaning system for use with a flammable solvent having safety features to maintain the concentration of solvent vapor in the cleaning chamber below a safe limit. In addition, the present system safely confines, extinguishes, and/or dissipates any fire or explosion within the cleaning chamber.

2. Statement of the Problem

Precision cleaning systems have been used for many years in fields where component surfaces must be cleaned to very fine cleanliness levels. For example, precision cleaning is frequently used in the aerospace, semiconductor, and biomedical industries. The cleaning process usually involves a spray of solvent directed against the surfaces of the workpiece to dislodge particulates and remove grease and other molecular contaminants. Conventional precision cleaning systems have commonly used any of a number of chlorofluorocarbon (CFC) compounds as the cleaning solvent. These CFC compounds are effective cleaning agents and are essentially chemically inert. In particular, CFC compounds are not flammable or explosive. Therefore, conventional precision cleaning systems have not had to deal with the possibility of combustion or explosion of the solvent spray.

CFC compounds have increasingly been the subject of environmental concerns in recent years. It is believed that CFC compounds may be a cause of ozone depletion in the upper atmosphere. As a result, production of CFC compounds is being phased out by the chemical industry. It is anticipated that commercial supplies of CFC compounds will become increasing difficult to obtain over the next several years. Efforts have therefore been undertaken to identify other compounds that can be used as solvents in precision cleaning systems.

One possible alternative is to use an alcohol, such as isopropyl alcohol, as the solvent. Alcohol has been used in the past as a solvent or cleaning agent. But, the prior art systems involve immersion of the workpiece in a bath of alcohol. Although some degree of fire risk is associated with using a vat of alcohol as in the prior art, there is a quantum increase in the risk associated with using an alcohol spray to clean the workpiece. The fine mist of alcohol droplets and the level of vapor phase alcohol resulting from spraying can quite easily produce highly flammable or explosive conditions within the cleaning chamber.

A number of cleaning systems have been invented in the past that use solvent sprays and include means to recycle used solvent, including the following:

| Inventor | Pat. No. | Issue Date |
|---|---|---|
| Rand | 4,101,340 | July 18, 1978 |
| Blaul | 4,561,903 | Dec. 31, 1985 |
| Blaul | 4,886,081 | Dec. 12, 1989 |

| Inventor | Pat. No. | Issue Date |
|---|---|---|
| Blaul | 4,676,261 | June 30, 1987 |
| Capella, et al. | 4,443,269 | Apr. 17, 1984 |
| Vetter | 4,688,585 | Aug. 25, 1987 |
| Rudolphi | 4,187,868 | Feb. 12, 1980 |
| Fowler, et al. | 4,865,061 | Sep. 12, 1989 |
| Petit, et al. | 4,940,494 | July 10, 1990 |
| Blackwood | 4,132,567 | Jan. 2, 1979 |
| Cherry | 4,936,922 | June 26, 1990 |
| Cherry, et al. | 4,832,753 | May 23, 1989 |
| Roberson, et al. | 4,977,688 | Dec. 18, 1990 |
| Weil | 5,011,542 | Apr. 30, 1991 |
| Koblenzer | 4,390,396 | June 28, 1983 |
| Hughes | 4,993,199 | Feb. 19, 1991 |

Rand discloses a solvent spray cleaning system for minimizing solvent losses. A treatment chamber has a spray cleaning zone and a sump separated by a wall and a closure member so that the spray cleaning zone can be isolated from the sump. During this isolation, solvent vapors are removed from the cleaning chamber to facilitate introduction and removal of work into the chamber.

The Blaul patents disclose a method of solvent spray cleaning in an enclosed chamber. A hand-directed spray nozzles directs a high pressure spray of solvent within the enclosed chamber. The internal air of the chamber and the solvent are continually recycled. The system also includes means to keep down the vapor concentration within the chamber by defogging the chamber air.

Capella, et al., disclose a system for cleaning contaminated articles using a high pressure spray gun within a cleaning chamber. The solvent is recycled within the unit.

Vetter discloses an automatic washer for cleaning objects having a housing with an opening for introduction of the object to be cleaned and a number of nozzles that are aligned and oriented appropriately to clean the surfaces of the object. A control device detects and responds to the shape, orientation, and position of the object to control the method and timely running of the cleaning process.

Rudolphi discloses a system for cleaning a surface of an optical element in which a cleaning liquid is applied to the surface and vibrated at a frequency (such as 20–50 kHz) to facilitate cleaning.

Fowler, et al., disclose a system for solvent spray cleaning in an enclosed chamber. The internal air of the chamber and the solvent are continually recycled. A cooling means within the exhaust duct condenses the solvent vaporized during the cleaning operation. The pressure within the chamber is reduced to sub-atmospheric pressure to prevent the possibility of leakage of contaminants from the chamber into the surrounding environment.

Petit, et al., disclose a process for cleaning a large part by submerging the part in a tank of solvent and then subjecting the submerged part to low-frequency ultrasound. The solvent can be recycled for future reuse.

Blackwood discloses an apparatus for cleaning and removing static charges from integrated circuit wafers. The wafers are successively revolved through a spray of deionizing water and drying nitrogen gas in a closed chamber. Ionized nitrogen gas is introduced into the chamber to eliminate static charge on the wafers.

The Cherry patents disclose a system for high purity cleaning in a chamber maintained at a pressure above ambient atmospheric pressure. Components to be cleaned are transported into the cleaning chamber on a gas-glide transporter mechanism. The components are first cleaned using a high pressure spray of individual droplets of solvent and are then dried by filtered air.

Roberson, et al. discloses a device for drying semiconductor wafers with isopropyl alcohol in vapor form.

Weil discloses a system for treating objects in a closed vessel with a solvent. The objects are boiled in a mixture of solvent and water in the vessel.

Koblenzer discloses an apparatus for distillation of solvents, such as alcohol.

Hughes discloses a portable self-contained decontamination booth. An exhaust air system maintains a negative pressure within the work station. The solvent is recycled.

3. Solution to the Problem

None of the prior art references uncovered in the search show a spray cleaning system for use with a flammable solvent, such as isopropyl alcohol, having safety features to maintain the concentration of solvent vapor within the cleaning chamber below a safe limit and to mitigate static discharge. Sensors detect the presence of combustion or an explosion within the cleaning chamber and automatically shut down the flow of solvent to the cleaning chamber. The system also is designed to safely confine, extinguish and/or vent any fire or explosion within the cleaning chamber.

SUMMARY OF THE INVENTION

This invention provides a spray cleaning system using a flammable solvent, such as isopropyl alcohol, including safety features to maintain the concentration of solvent vapor within the cleaning chamber below a safe limit. The system includes a cleaning chamber, a nozzle for directing a spray of solvent against the article to be cleaned in the chamber, and a pump for supplying solvent to the nozzle. The chamber is ventilated with a flow of air to maintain the concentration of solvent vapor within the chamber below a predetermined safety limit, such as the lower explosive limit for the solvent, and the air is exhausted to create a negative pressure within the chamber. Sensors detect combustion or an explosion within the chamber. Additional sensors can be included to monitor leakage of solvent from the cleaning chamber or solvent supply tank. The flow of solvent to the nozzle is automatically halted in the event of combustion or explosion, or if leakage is detected. A fire extinguishing system is also automatically triggered. Electrical continuity to ground is maintained among all of the components of the cleaning chamber as well as the solvent storage tank, pumps, and pipelines to mitigate static discharge.

A primary object of the present invention is to provide a spray cleaning system designed to safely handle a flammable solvent by maintaining the concentration solvent vapor within the cleaning chamber below a safe limit.

Another object of the present invention is to provide a spray cleaning system designed to safely handle a flammable solvent by automatically shutting down the solvent spray if hazardous conditions are detected within the cleaning chamber.

Another object of the present invention is to provide a spray cleaning system in which any fire or explosion within the cleaning chamber is safely contained, extinguished, and/or vented.

Yet another object of the present invention is to provide a precision cleaning system in which the solvent is collected after use, filtered, and returned to storage tanks for reuse.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
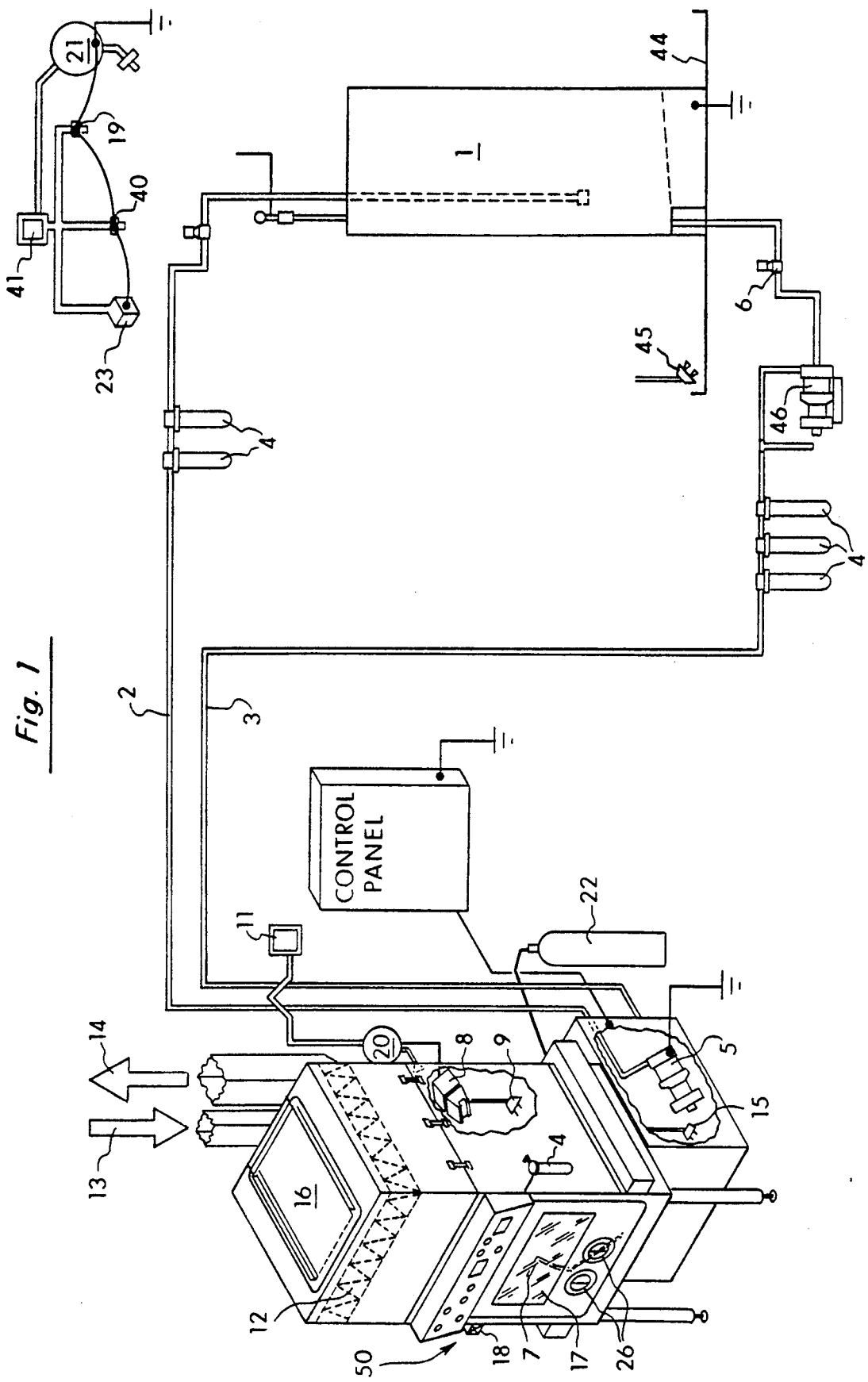
FIG. 1 is a simplified schematic diagram of one embodiment of the spray cleaning system.
Figure 2:
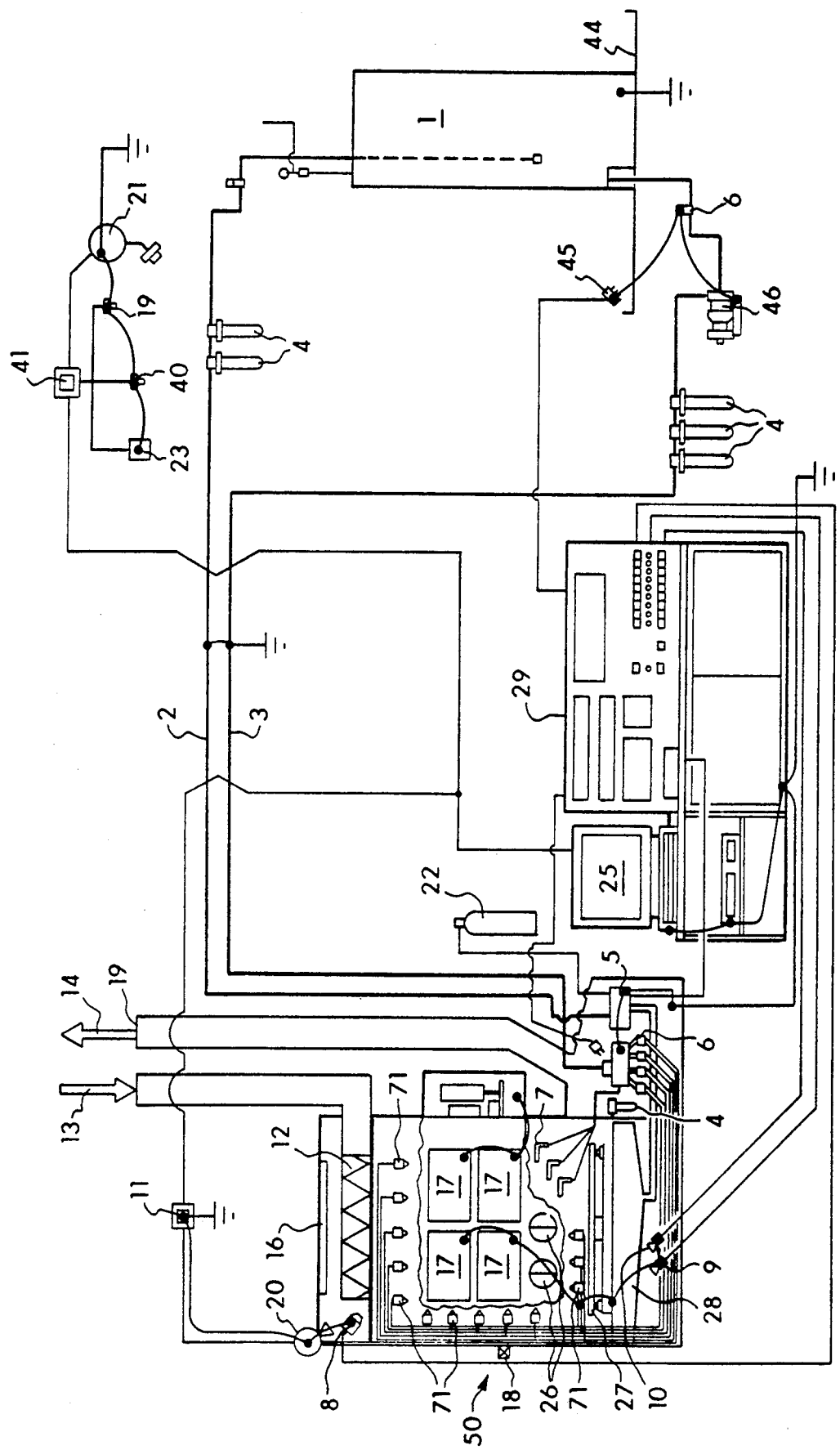
FIG. 2 is a perspective view of the cleaning chamber of a second embodiment of the spray cleaning system. The cleaning chamber is shown in cross-section.
Figure 3:
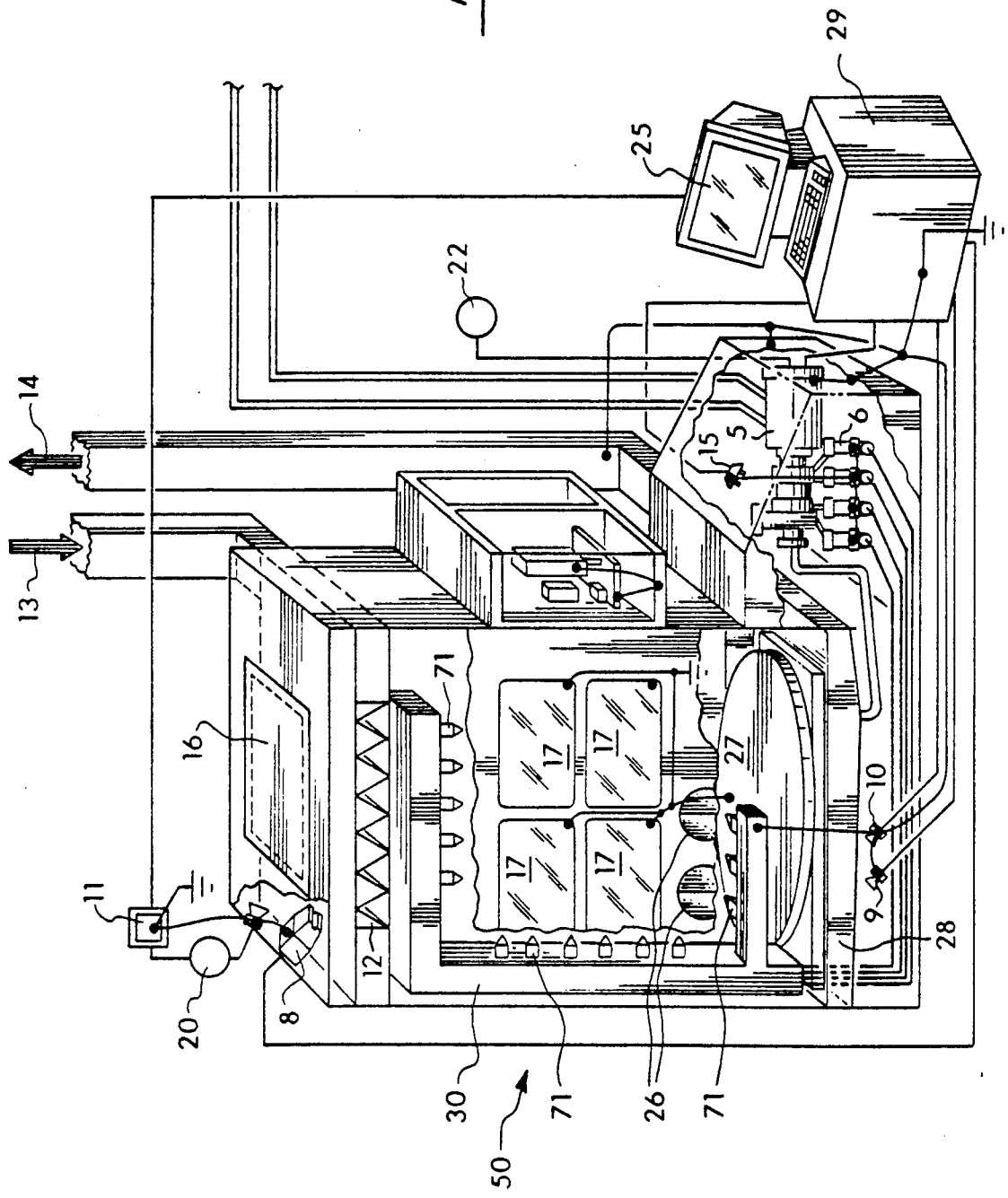
FIG. 3 is a simplified schematic diagram of the second embodiment of the spray cleaning system corresponding to FIG. 2. Selected portions of the cleaning chamber have been cut away to reveal internal components.

Turning to FIG. 1, a simplified schematic drawing is provided of a first embodiment of the system in which the solvent spray is manually directed. FIGS. 2 and 3 are corresponding simplified schematic drawings of a second embodiment in which the spraying process can be automated.

In both embodiments, a supply of a flammable solvent (e.g. isopropyl alcohol) is held in one or more supply tanks 1. The supply tanks are sized to meet the individual user needs based on the amount of solvent required for the application. Heat-activated devices (HAD) 23 are used to detect the presence of heat from any combustion resulting from leakage of solvent from the supply tanks 1. A fire extinguishing system 21 is automatically triggered to release a dry chemical fire suppressant (e.g. carbon dioxide snow) to smother the fire. Audible and remote alarms 41 are also triggered to alert proper authorities.

A vapor sensor 19 is used to detect the presence of solvent vapors indicating that a leakage of solvent has occurred adjacent to the supply tanks. In this event, the vapor sensor 19 automatically shuts down the pumping of solvent from the supply tanks 1 to the remainder of the system and triggers alarm 41. An oxygen sensor 40 located adjacent to the storage tanks serves as a backup for vapor sensor 19. The oxygen sensor 40 triggers the alarm 41 when the concentration of oxygen falls below a predetermined limit (e.g. 19½ percent) in the area around the supply tanks 1. The vapor sensor 19 and the oxygen sensor 40 can also turn on fans to vacate the fumes and supply fresh air to the area. The supply tank 1 includes a secondary containment area 44 to contain any solvent leakage. A liquid sensor 45 located in this secondary containment area 44 detects any such solvent leakage. Finally, a head of inert gas, such as nitrogen, is maintained above the liquid solvent in the supply tank 1. The head pressure is nominal, but is sufficient to minimize any accumulation of flammable solvent vapor within the supply tank 1.

Solvent is pumped from the supply tank 1 by a supply pump 46. The solvent flows through a series of filters 4 in the supply line 3 to remove contaminants. In the preferred embodiment, the solvent alcohol is filtered to absolute micronic levels. The solvent is then delivered under pressure to one or more nozzles 7 within the cleaning chamber 50.

The cleaning chamber 50 is a glove box structure enclosing an interior volume large enough to accommodate the articles to be cleaned. A hinged door allows egress into the cleaning chamber 50. When the door is open, an interlock system 18 causes the solvent supply to the nozzles to automatically shut off for safety.

In the embodiment shown in FIG. 1, nozzle 7 is connected at the end of a flexible hose within the cleaning chamber 50. Operation of the nozzle 7 and the direction of the solvent spray are manually controlled by an operator through glove ports 26 extending through the front wall of the cleaning chamber 50. In the embodiment shown in FIGS. 2 and 3, an array of automatically controlled nozzles 71 attached to fixed or movable arms within the cleaning chamber 50 are intended as the primary means for spraying solvent on the article to be cleaned. Operation of the movable arms and the flow of solvent to each nozzle 71 can be individually regulated by a controller (such as a computer 29 with a display screen 25) to tailor the cleaning process to specific components and assemblies to be cleaned. A manually controlled nozzle 7 can also be provided, as in the embodiment depicted in FIG. 1.

A number of windows 17 allow the operator to visually monitor the workpiece, nozzles, and the interior of the cleaning chamber. In the preferred embodiment, the windows 17 are made of polycarbonate panels with a transparent metallized interior coating (e.g. nickel). The cleaning chamber 50 is also made of metal or other conductive materials. Thus, virtually the entire interior surface of the cleaning chamber 50 is conductive so that any electrical potential or streaming current generated will be safely dissipated to ground. This feature greatly reduces the risk of fire or explosion that might otherwise be caused by the discharge of static electricity within the cleaning chamber.

A return reservoir or sump 28 is located at the bottom of the cleaning chamber 50 to collect used solvent. The used solvent is then pumped back by a return pump 5 through the return line 2 into the supply tank 1 for reuse. The return pump provides sufficient pressure to overcome the head pressure of the inert gas within the supply tank 1. The used solvent also passes through a number of filters 4 in the return line 2 to remove contaminants. A distillation system can be added to provide a high level of cleanliness to the recycled solvent.

The cleaning chamber 50 is designed to have structural characteristics sufficient to withstand fire or an explosion within the cleaning chamber. A gated explosion relief vent 16 is located in the top of the cleaning chamber 50. In the event of an explosion within the cleaning chamber 50, this pressure relief vent directs any overpressure in a safe direction (e.g. upward) away from the operator and area occupants.

A fan, blower, or other ventilation means induces a flow of air through the cleaning chamber 50. In the preferred embodiment, the supply air 13 enters the cleaning chamber through a filter 12, such a conventional HEPA filter, to remove contaminants. The flow rate of air through the cleaning chamber 50 is designed to be sufficient to maintain the concentration of solvent vapor within the cleaning chamber below a predetermined safety threshold. For example, the concentration of solvent vapor should be maintained below the lower explosive limit for the solvent. Exhaust air 14 is vented to the outside. If desired, solvent fumes can be removed from the exhaust air by incorporating a volatile organic compounds (VOC) treatment/recovery system in the exhaust duct. In the preferred embodiment the blower is located on the exhaust side of the ventilation system to create a negative pressure inside the cleaning chamber and the exhaust conduit. This tends to reduce the escape of solvent fumes and also reduces the overpressure associated with an explosion within the cleaning chamber.

A combustion sensor 8 detects the presence of heat from any combustion within the cleaning chamber 50. An infrared sensor can be employed for this purpose. In the preferred embodiment, this sensor 8 also includes an ultraviolet sensor to detect the flash of ultraviolet light accompanying ignition of the solvent vapor within the cleaning chamber. The infrared and ultraviolet sensor can be combined in a single IR/UV sensor 8 as shown in the figures. In the event either the IR or UV sensor detects a hazardous condition, a fire extinguishing system 20 is automatically triggered to release a dry chemical fire suppressant (e.g. carbon dioxide snow) to smother the fire or explosion. Audible and remote alarms 11 are also triggered to alert proper authorities. The flow of solvent to the nozzles is also automatically discontinued by shutting off the supply pump 45 and closing a valve 6 in the supply line.

Also included is a vapor sensor 9 to detect excessive leakage of solvent fumes from the cleaning chamber. In this event, the vapor sensor 9 automatically shuts down the flow of solvent to the nozzles 7 and triggers the alarm 11. An oxygen sensor 10 serves as a backup for the vapor sensor 9. The oxygen sensor 10 triggers the alarm 11 and halts the flow of solvent to the nozzles if the concentration of oxygen falls below a predetermined limit indicating leakage of solvent from the cleaning chamber. A liquid sensor 15 located in the area below the return reservoir 28 also detects any such solvent leakage.

Figure 4:
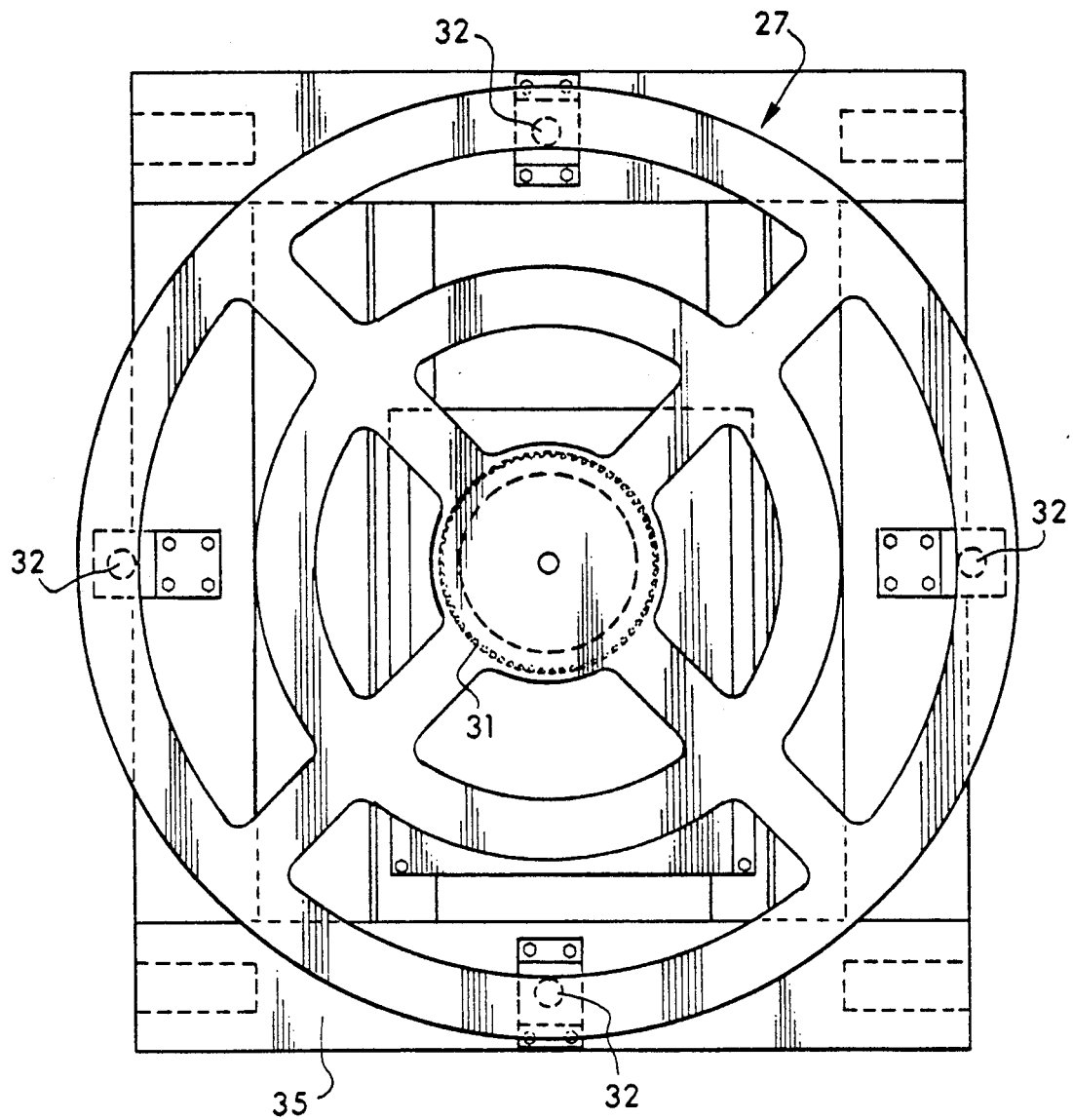
FIG. 4 is a top view of the turntable assembly used to support the object to be cleaned in the cleaning chamber.
Figure 5:
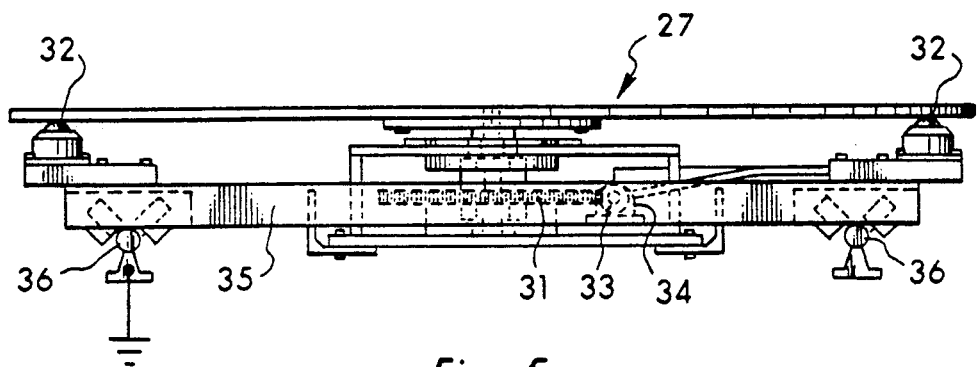
FIG. 5 is a side cross-sectional view of the turntable assembly corresponding to FIG. 4.

FIGS. 4 and 5 show details of the turntable assembly used to support and rotate the article being cleaned within the cleaning chamber 50. The turntable 27 is rotatably supported at points around its periphery on rollers 32. The turntable 27 is rotated by a gas-driven motor 34 through a spur gear arrangement 33 and 31. The entire assembly, including the base platform 35 supporting the motor 34, gears 33 and 31, and turntable 27, can be readily transported into and out of the cleaning chamber on two parallel glide bearings 36.

It should be noted that the cleaning chamber can use any of a number of cleaning agents other than alcohol. In addition, the nozzles can also be used to introduce gases such as carbon dioxide or nitrogen from an external supply 22 to supplement cleaning or to dry the workpiece after cleaning.

When dealing with a flammable solvent such as isopropyl alcohol, it is very important to minimize the risk of static discharge that might ignite the solvent spray. The present system seeks to minimize this risk by maintaining electrical continuity to ground among the cleaning chamber and all of its components. In particular, the cleaning chamber surfaces, vents, ducting, valves, filters, fittings, sensors, return tank, and controls are metallic. All non-metallic materials that are capable of generating static are provided with a metallic coating to maintain continuity and conductivity. For example, the polycarbonate window in the cleaning chamber has a thin transparent nickel coating on its interior surface. The system components outside of the cleaning chamber are also electrically conductive and grounded, including the supply tanks, supply and return lines, pumps, filters, sensors, valves, fittings, controls and reprocessing tank.

The above disclosure sets forth a number of embodiments of the present invention. Other arrangements or embodiments, not precisely set forth, could be practiced under the teachings of the present invention and as set forth in the following claims.

We claim:

1. A spray cleaning system using a flammable solvent comprising:
   a chamber for containing an article to be cleaned;
   a nozzle for directing a spray of solvent against said article within said chamber;
   pump means for supplying a flow of solvent to said nozzle;
   ventilation means for inducing a flow of air through said chamber to maintain the concentration of solvent vapor within said chamber below a predetermined threshold;
   sensor means for detecting combustion of said solvent in said chamber;
   means for discontinuing the flow of solvent to said nozzle in response to said sensor means; and
   means for maintaining electrical continuity among said chamber and components within said chamber to mitigate static discharge.

2. The spray cleaning system of claim 1 wherein said chamber further comprises a window having a conductive inner surface.

3. The spray cleaning system of claim 1 wherein said sensor means comprises an infrared sensor.

4. The spray cleaning system of claim 1 wherein said sensor means further comprises an ultraviolet sensor for detecting explosion of said solvent within said chamber.

5. The spray cleaning system of claim 1 further comprising means for extinguishing a fire within said chamber controlled by said sensor means.

6. The spray cleaning system of claim 1 further comprising sensor means for detecting leakage of solvent from said chamber.

7. The spray cleaning system of claim 1 further comprising a gated vent in said chamber for venting an explosion within said chamber in a safe direction.

8. The spray cleaning system of claim 1 further comprising air filtration means for removing contaminants from air drawn into said chamber by said ventilation means.

9. The spray cleaning system of claim 1 further comprising:
   means for collection of used solvent from said chamber;
   filter means for removing impurities from said used solvent; and
   a supply tank connected to said pump means for storing said solvent for reuse.

10. A spray cleaning system using a flammable solvent comprising:
    a chamber for containing an article to be cleaned;
    a nozzle for directing a spray of solvent against said article within said chamber;
    a supply tank containing solvent;
    pump means for supplying a flow of solvent from said supply tank to said nozzle;
    means for returning used solvent from said chamber to said supply tank;
    solvent filter means for removing contaminants from said used solvent;
    ventilation means for inducing a flow of air through said chamber to maintain the concentration of solvent vapor within said chamber below a predetermined threshold;
    sensor means for detecting combustion of said solvent within said chamber;
    means for discontinuing the flow of solvent to said nozzle in response to said sensor means: and
    means for maintaining electrical continuity among said chamber, supply tank, pump means, return means, and solvent filter to mitigate static discharge.

11. The spray cleaning system of claim 10, wherein said chamber, supply tank, pump means, return means and solvent filter are electrically grounded.

12. The spray cleaning system of claim 10, wherein said sensor means comprises an infrared sensor.

13. The spray cleaning system of claim 10 wherein said sensor means further comprises an ultraviolet sensor for detecting explosion of said solvent within said chamber.

14. The spray cleaning system of claim 10 further comprising a gated vent in said chamber for venting an explosion within said chamber in a safe direction.

15. The spray cleaning system of claim 10 further comprising air filtration means for removing contaminants from air drawn into said chamber by said ventilation means.

16. The spray cleaning system of claim 10 further comprising means for maintaining a head of noncombustible gas in said supply tank.

17. A spray cleaning system comprising:
    a chamber for containing an article to be cleaned;
    a nozzle for directing a spray of alcohol against said article within said chamber;
    a supply tank containing alcohol and a head of noncombustible gas;
    a supply pump for supplying a flow of alcohol from said supply tank to said nozzle;
    a return pump for returning used alcohol from said chamber to said supply tank;
    solvent filter means for removing contaminants from said used alcohol;
    ventilation means for inducing a flow of air through said chamber to maintain the concentration of alcohol vapor within said chamber below a predetermined threshold;
    air filtration means to remove contaminants from said air entering said chamber;
    an infrared sensor for detecting combustion within said chamber;
    an ultraviolet sensor for detecting an explosion within said chamber;
    means for discontinuing the flow of alcohol to said nozzle in response to said sensors; and
    means for maintaining electrical continuity among said chamber, supply tank, supply pump, return pump, and solvent filter to mitigate static discharge.

18. The spray cleaning system of claim 17, wherein said chamber, supply tank, pump means, return means and solvent filter are electrically grounded.

19. The spray cleaning system of claim 17, further comprising means for extinguishing a fire within said chamber controlled by at least one of said sensors.

20. The spray cleaning system of claim 17 further comprising a gated vent in said chamber for venting an explosion within said chamber in a safe direction.

* * * * *